US006737323B2

(12) United States Patent
Mo (10) Patent No.: US 6,737,323 B2
(45) Date of Patent: May 18, 2004

(54) METHOD OF FABRICATING A TRENCH STRUCTURE SUBSTANTIALLY FILLED WITH HIGH-CONDUCTIVITY MATERIAL

(75) Inventor: Brian S. Mo, Stanford, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/879,029

(22) Filed: Jun. 11, 2001

(65) Prior Publication Data

US 2002/0024091 A1 Feb. 28, 2002

Related U.S. Application Data (62) Division of application No. 09/343,330, filed on Jun. 30, 1999, now Pat. No. 6,274,905.

(51) Int. Cl.[7] .............................................. H01L 21/336
(52) U.S. Cl. .................. 438/270; 438/386; 438/396; 438/648; 438/761; 438/519; 438/256; 438/253; 438/239
(58) Field of Search ................................. 257/388, 397, 257/333, 332, 330; 438/386, 396, 648, 761, 519, 270, 256, 253, 239

(56) References Cited

U.S. PATENT DOCUMENTS

| | | |
|---|---|---|
| 4,441,247 A | 4/1984 | Gargini et al. |
| 4,503,601 A | 3/1985 | Chiao |
| 4,881,105 A | 11/1989 | Davari et al. |
| 4,983,535 A | 1/1991 | Blanchard |
| 5,021,846 A | 6/1991 | Ueno |
| 5,455,190 A | 10/1995 | Hsu |
| 5,474,943 A | 12/1995 | Hshieh et al. |
| 5,508,534 A | 4/1996 | Nakamura et al. |
| 5,648,670 A | 7/1997 | Blanchard |
| 5,808,340 A | 9/1998 | Wollesen et al. |
| 6,051,468 A | 4/2000 | Hshieh |
| 6,097,061 A * | 8/2000 | Liu et al. ..................... 257/330 |
| 6,486,067 B1 * | 11/2002 | Shen et al. ................. 438/704 |

FOREIGN PATENT DOCUMENTS

JP        10-173072      *  6/1998    ....... H01L/21/8244

OTHER PUBLICATIONS

Stanley Wolf and Richard N. Tauber, "Silicon Processing for the VLSI Era: vol. 1" Lattice Press, Sunset Beach, CA, (1986) pp. 181–182.*

Arthur Sherman, "Chemical Vapor Deposition for Microelectronics," Noyes Publ., Westwood, New Jersey, (1993), pp. 94,139.*

Syd R. Wilson, Clarence J. Tracy and John L. Freeman, Jr., "Handbook of Multilevel Metallization for Integrated Circuits," Noyes Publ., Westwood, New Jersey, (1993), pp. 73–75, 139–140.*

Hugh O. Pierson, "Handbook of Chemical Vapor Deposition," Noyes Publ., Norwich, New York, (1999), pp. 22–31.*

Stanley Wolf and Richard N. Tauber, "Silicon Processing for the VLSI Era: vol. 1" Lattice Press, Sunset Beach, CA, (1986) pp. 181–182.*

(List continued on next page.)

Primary Examiner—Eddie Lee
Assistant Examiner—Thomas Magee
(74) Attorney, Agent, or Firm—Townsend and Townsend and Crew LLP (57) ABSTRACT

A trench structure that is substantially filled with high-conductivity material such as refractory metal particularly suitable for fast switching trench MOSFET applications. The trench is first lined by a dielectric material such as silicon dioxide. A layer of polysilicon is then formed on the dielectric material and provides buffering for stress relief. The trench is then filled substantially with refractory metal such as tungsten.

17 Claims, 6 Drawing Sheets

OTHER PUBLICATIONS

Arthur Sherman, "Chemical Vapor Deposition for Microelectronics," Noyes Publ., Westwood, New Jersey, (1993), pp. 94, 139.*

Syd R. Wilson, Clarence J. Tracy and John L. Freeman, Jr., "Handbook of Multilevel Metallization for Integrated Circuits," Noyes Publ., Westwood, New Jersey, (1993), pp. 73–75, 139–140.*

Arthur Sherman, "Chemical Vapor Deposition for Microelectronics" Noyes Publ., New Jersey,(1987) pp. 94, 139.*

Syd R. Wilson, Clarence J. Tracy, and John L. Freeman,Jr., "Handbook of Multilevel Metallization for Integrated Circuits", Noyes Publ., (New Jersey), pp. 73–75, 139–140.*

Aniruddha B. Joshi, et al., *Study of the Growth Temperature Dependence of Performance and Reliability of Thin MOS Gate Oxides, Proceedings: IEEE Transactions of Electron Devices*, vol. 39, No. 9, pp. 2099–2107, Sep. 1992.

Henry J. Geipel et al., *Composite Silicide Gate Electrodes—Interconnections for VLSI Device Technologies, Proceedings: IEEE Transactions on Electron Devices*, vol. ED–27, No. 8, pp. 1417–1424, Aug. 1980.

* cited by examiner

METHOD OF FABRICATING A TRENCH STRUCTURE SUBSTANTIALLY FILLED WITH HIGH-CONDUCTIVITY MATERIAL

CROSS REFERENCE TO RELATED APPLICATIONS

This application is a divisional of and claims the benefit of U.S. Patent Application Ser. No. 09/343,330 filed Jun. 30, 1999 now U.S. Pat. No. 6,274,905.

BACKGROUND OF THE INVENTION

The present invention relates in general to semiconductor devices and processing, and in particular to trench structures used in, for example, trench metal-oxide-semiconductor field effect transistors (MOSFETs), and methods of their manufacture.

Figure 1:
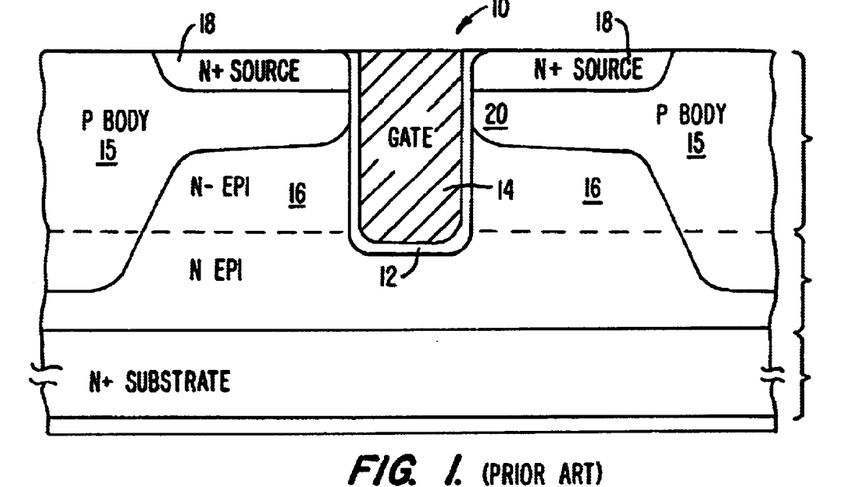
FIG. 1 shows a cross section of a typical trench transistor.

FIG. 1 is a simplified cross section of a portion of an n-channel trench MOSFET. A trench 10 is lined with an electrically insulating material 12, such as silicon dioxide, that acts as gate dielectric. It is then filled with a conductive material 14, such as polysilicon, that provides the transistor gate terminal. The trench extends into an n-type drain region 16 which may be electrically contacted through the substrate of the device. A p-type well or body region 15 is formed on top of the substrate, and n-type source regions 18 are formed on either sides of trench 10 as shown. The active region of the MOS transistor is thus formed in channel region 20 adjacent to gate 14 and between source 18 and drain 16.

Figure 2:
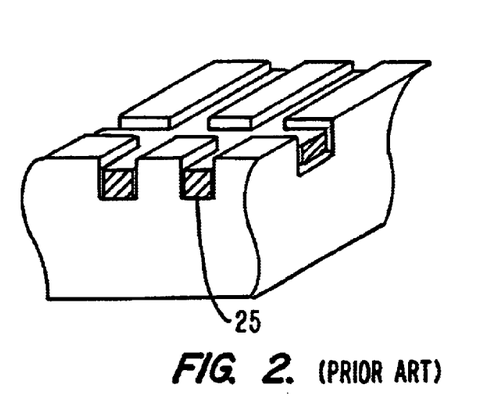
FIG. 2 is a simplified perspective view of a closed-cell gate configuration.
Figure 3:
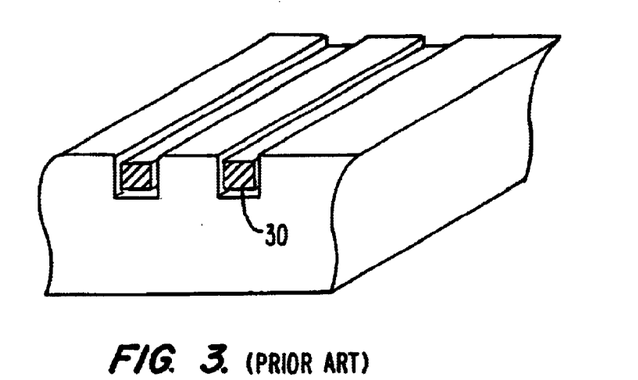
FIG. 3 is a simplified perspective view of an open-cell gate configuration.

Trench transistors are often used in power-handling applications, such as power supply management circuitry, hard disk drive circuitry, etc. Trench transistors may operate at 12–100 V, as compared to 2–5 V for a logic-type MOSFET. The gate of a trench transistor, which is proportional to the depth of the trench, is made relatively wide to improve the current-handling capability of the trench transistor. The section of the trench transistor shown in FIG. 1 is often referred to as a cell because it contains one portion of the device that is repeated across the die. The trenches in, for example, power MOSFETs, are typically laid out in either a grid pattern 25, as shown in FIG. 2, forming a closed cell configuration, a stripe pattern 30, as shown in FIG. 3, forming an open cell configuration, or other type of patterns, such as a hexagonal pattern. With the substrate of the die acting as the common drain terminal for the cells, all source terminals are connected together and all gate terminals are connected together to form one large trench MOSFET.

Figure 4:
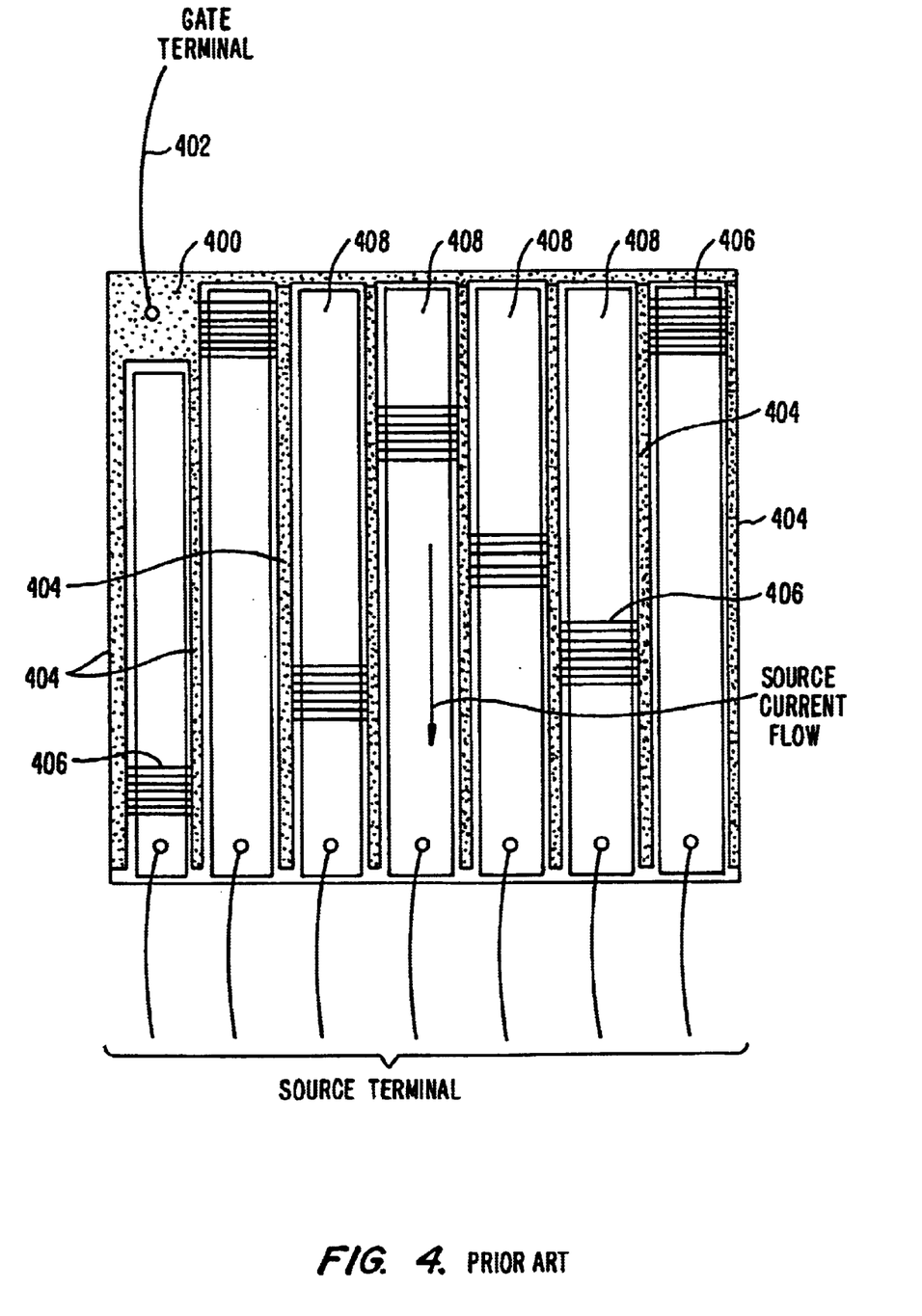
FIG. 4 is a top view of a trench MOSFET die showing gate and source busing on the die surface.

For many applications a key performance characteristic of the trench MOSFET is its switching speed. To maximize the switching speed of the trench MOSFET it is desirable to minimize the resistivity of its gate material. As the die size for larger power MOSFETs and the length of trenches increases, the speed at which gate charge is distributed across the length of the trenches becomes a concern. To decrease the gate resistivity for the larger trench MOSFETs, trenches are typically divided into shorter segments and gate metal contact is distributed across the surface of the die. FIG. 4 is a top view of a die showing gate and source wiring for a large trench power MOSFET of the open cell type. The gate which is typically made of metal (e.g. aluminum) includes bonding pad area 400 that receives bond wire 402, and gate buses 404 that extend in parallel across the die. Gate buses 404 distribute the gate bias voltage to trenches 406, only a few of which are shown for illustrative purposes. Accordingly, instead of relying on the gate material inside each trench, which is typically polysilicon, to propagate the gate bias voltage, metal buses 404 ensure faster and more uniform distribution of gate charge to the far end trenches across the die. Thus, gate buses 404 provide a low-resistance path from gate bonding pad 402 to the active gates across the die, improving the switching speed of the MOSFET.

The improved switching speed that is brought about by the busing of the gate electrode across the die, however, comes at the price of increased resistivity on the source electrode. This is because instead of having a single contiguous metal layer blanketing the top surface of the die, the source metal layer must be broken into several sections 408 to allow for gate busing. The higher source resistivity adversely impacts the MOSFET's drain-to-source on resistance $R_{DSon}$, another speed-critical performance characteristic for power MOSFETs.

It is therefore desirable to produce a trench that is filled with low resistivity material for applications such as trench MOSFETs where lower gate resistivity and faster switching can be obtained without adversely impacting $R_{DSon}$.

SUMMARY OF THE INVENTION

The present invention provides a trench structure that is substantially filled with refractory metal to form, for example, MOSFET gate terminals with low resistivity and fast switching speed. A trench transistor fabricated with the trench process according to the present invention exhibits lower gate resistivity for faster switching while maintaining low gate leakage current. The lower resistivity of the gate material eliminates the need for busing of the gate contact metal across the top surface of the die. This in turn allows for a single-square, contiguous source contact layer for optimum $R_{DSon}$.

In a specific implementation, after the formation of the trenches and the gate dielectric layer, a buffer layer of, for example, polysilicon is formed over the gate dielectric layer. A refractory metal such as tungsten is then deposited over the buffer polysilicon layer using, for example, tungsten hexafluoride in a low-pressure chemical-vapor deposition (LPCVD) process. The buffer polysilicon layer relieves stress present in the gate dielectric layer and reduces gate leakage. The use of metal as the gate material reduces doping requirement for the buffer poly. This results in lower gate leakage current for n-channel trench MOSFETs and can eliminate problems associated with high energy implants such as boron penetration in p-channel trench MOSFETs.

Accordingly, in one embodiment, the present invention provides a trench structure including a trench formed in a substrate, a dielectric material lining at least a wall of the trench to form a dielectric layer, a buffer layer formed on the dielectric layer, the buffer layer having a first conductivity, and a high-conductivity layer formed adjacent to and electrically coupled to the buffer layer, the high-conductivity layer having a second conductivity greater than the first conductivity.

In a more specific embodiment, the present invention provides a trench metal-oxide-semiconductor field effect transistor (MOSFET) including a trench formed in a silicon substrate, a gate oxide layer lining side-walls and bottom of the trench, a polysilicon buffer layer lining the gate oxide layer, and a metal layer filling a center portion of the trench.

In yet another embodiment, the present invention provides a method for fabricating a trench structure in a substrate, the method including the steps of (a) forming a trench in the substrate; (b) forming a dielectric layer to line the trench; (c) forming a layer of buffer material on the dielectric layer to fill a first portion of the trench, the buffer material having a first electrical conductivity; and (d) filling a second portion of the trench with a high-conductivity material having a second electrical conductivity, the second electrical conductivity being greater than the first electrical conductivity.

The following detailed description and the accompanying drawings provide a better understanding of the nature and advantages of the refractory metal gate trench MOSFET of the present invention.

DESCRIPTION OF THE SPECIFIC EMBODIMENTS

The present invention provides a trench structure for use in, for example, double-diffused power transistors (DMOS) exhibiting superior operating characteristics, specifically, faster gate switching and lower $R_{DSon}$. These advantages are obtained by making a trench structure with a gate material that is made up substantially of high conductivity material such as refractory metal. While the trench structure according to the present invention is described in the context of trench MOSFETs, it is to be understood that similar advantages can be obtained in other semiconductor structures such as trench capacitors and the like.

Figure 5:
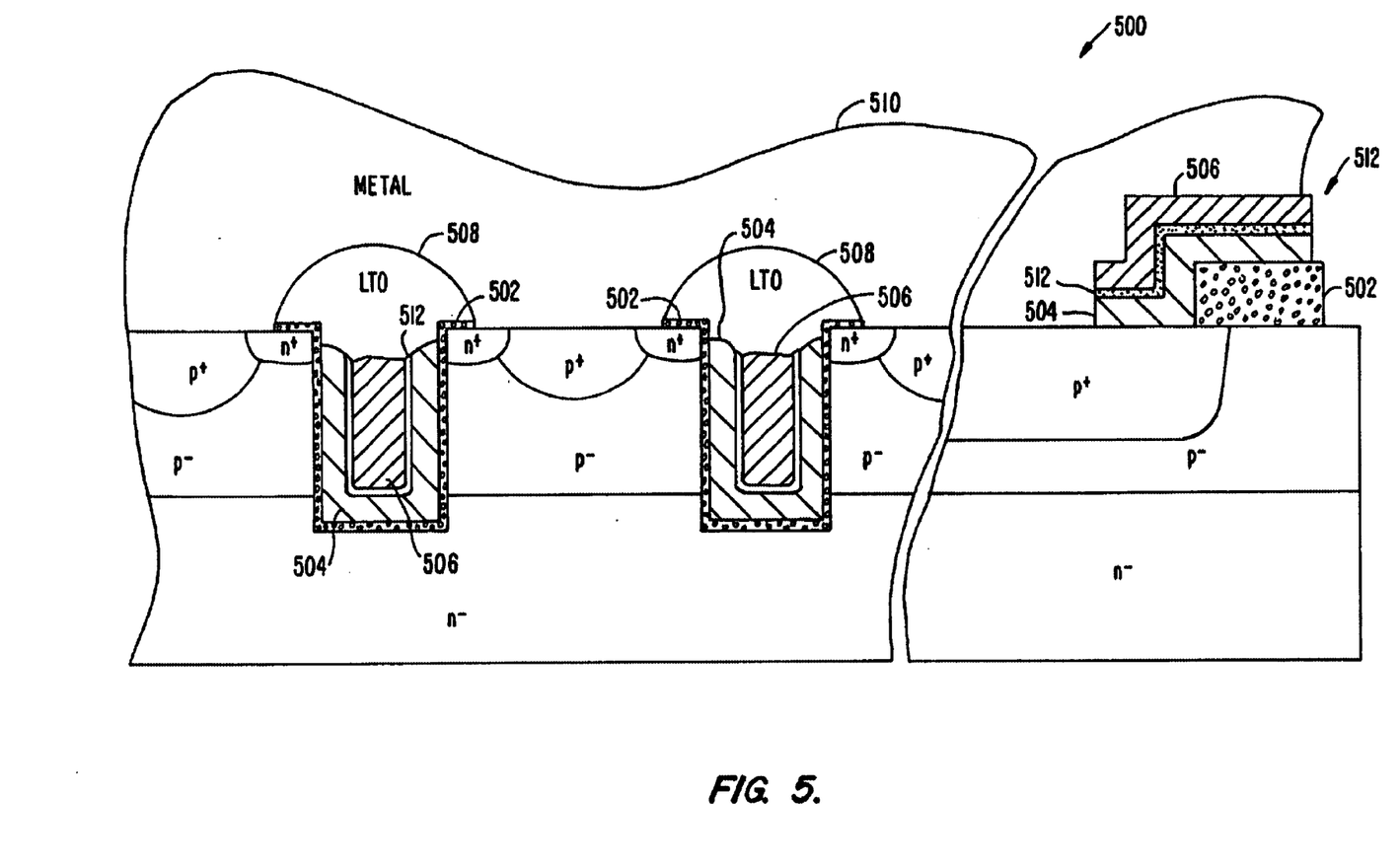
FIG. 5 is a simplified cross section of a portion of a trench transistor according to one embodiment of the present invention.

Referring to FIG. 5, there is shown a simplified cross section of a portion of an exemplary n-channel trench transistor 500 with a low-resistance gate according to one embodiment of the present invention. Each trench is lined with a thin layer of dielectric material such as silicon dioxide (gate oxide) 502, and then filled with a buffer layer 504 and a high-conductivity center portion 506. Buffer layer 504 is preferably made up of doped polysilicon and the high-conductivity center portion 506 is made up of refractory metal such as tungsten. If the trench undergoes a subsequent temperature cycle, a layer of tungsten polycide ($WSi_x$) 512 will be formed at the polysilicon-tungsten interface. It is to be understood that the term "polycide" used herein refers to silicide as well as polycide. A dielectric layer 508 overlies the gate region and electrically isolates the gate from source metallization layer 510. The gate is electrically coupled to a gate bus or termination area 512. The high-conductivity center portion of the gate provides a low resistance path from the gate bus to the active gate area.

A direct interface between high-conductivity layer 506 and gate oxide layer 502 may create stress in the gate oxide degrading the breakdown strength of the gate oxide layer, and possibly increasing the gate leakage current, $I_{GSS}$. Buffer layer 504 serves to maintain the dielectric strength of gate oxide layer 502 and promotes adhesion between gate oxide layer 502 and high-conductivity gate material 506, reducing peel-off. With current state of the art, buffer layer 504 may have a thickness of about 2,000 to 3,000 Å.

Figure 6A:
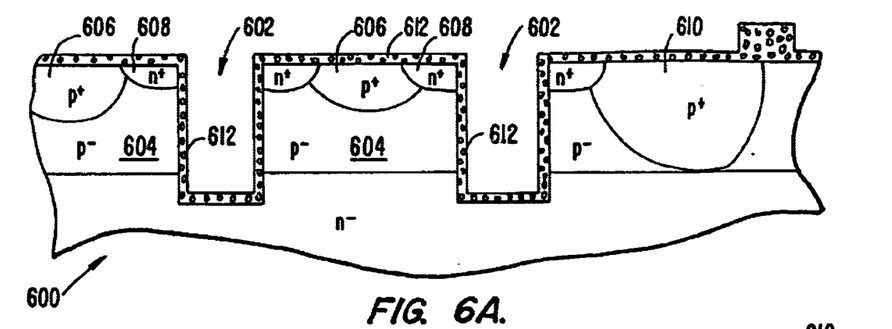
FIGS. 6A–6D illustrate cross sections of a portion of a substrate being fabricated to produce a metal-gate trench transistor according to an embodiment of the present invention.

A preferred method of fabricating an exemplary n-channel metal gate trench MOSFET according to the present invention will be described hereinafter in connection with the cross-sectional views shown in FIGS. 6A–6D and the process flow diagram of FIG. 7. It is to be understood that the use of an n-channel transistor is for illustrative purposes only, and that the same advantages can be obtained for a p-channel MOSFET fabricated according to the principles teachings of the present invention. Referring to FIG. 6A, there is shown an exemplary cross section of a portion of a substrate 600 processed up to the formation of trenches 602. This includes the various steps that form p-well 604, heavy body 606, source regions 608, and cell termination well 610. Further, trenches 602 have been formed in the substrate, and a thin dielectric layer 612 lines the trenches. Dielectric layer 612 acts as the gate dielectric, and is typically made of silicon dioxide but could be made of other dielectric material such as a nitride, or oxynitride. It is to be understood that any one of a number of known trench processes, including those with different well or body structures, can be employed for performing these or similar steps to prepare the substrate up to this point. An example of a preferred trench MOSFET process describing these steps in greater detail can be found in commonly-assigned patent application Ser. No. 08/970,221, titled "Field Effect Transistor and Method of its Manufacture," which is hereby incorporated by reference in its entirety.

Figure 6B:
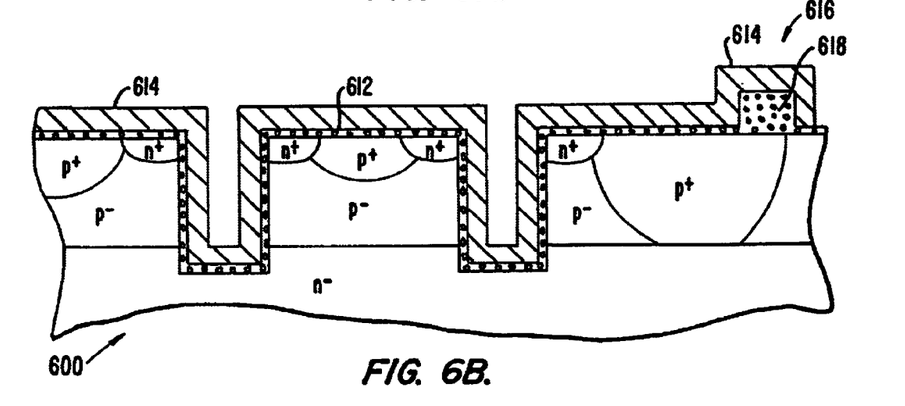

Referring to FIG. 6B, after the formation of gate dielectric layer 612, a layer of polysilicon 614 is deposited over the substrate including over termination area 616 which is isolated from the substrate by a thick oxide region 618. It is understood that as used herein the term "polysilicon" includes polysilicon and amorphous silicon. Polysilicon layer 614 is doped using conventional doping processes such as $POCL_3$ for n-type poly (n-channel transistor), p-type (e.g., boron) or n-type (e.g., phosphorous) implant for p-channel or n-channel transistors, respectively, or in-situ doping of n or p type dopants. Exemplary sizes for the various dimensions may be, for example, about 1 μm for the starting width of the trenches, about 500 Å for the gate oxide thickness, and about 3000 Å for the polysilicon thickness.

Figure 6C:
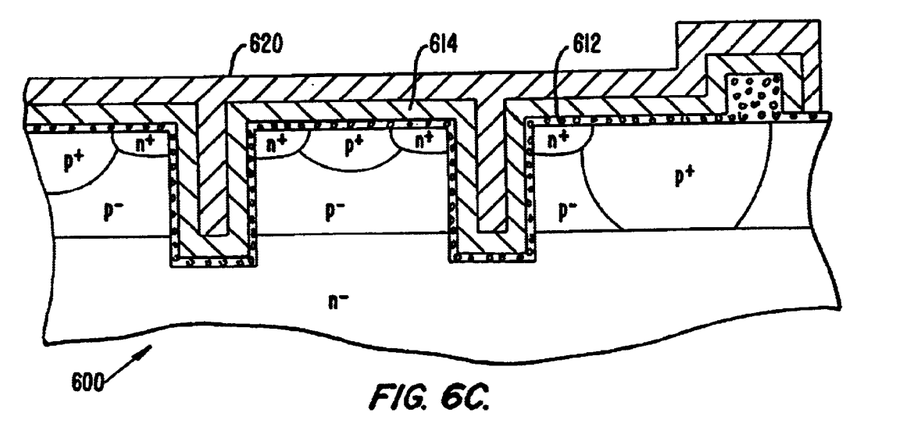

Next, a layer of high-conductivity material such as metal 620, is deposited over poly 614 as shown in FIG. 6C. The layer of high-conductivity material 620 may be any type of refractory metal such as tungsten, titanium, platinum, copper, or the like. Tungsten is used herein for illustrative purposes. The metal formation step is performed using preferably a low-pressure chemical vapor deposition (LPCVD) process with a fluoride-containing compound such as tungsten hexafluoride ($WF_6$) as a precursor. Other processes, such as physical vapor deposition (sputtering) and sintering may be used, but LPCVD exhibits low sticking coefficient, which results in a very conformal deposition, and reliably fills the trenches in a void-free manner. Further, it is believed that fluorine from the reaction of the precursor used in the tungsten formation migrates through polysilicon 614 and segregates at the interface between the bulk silicon and gate oxide 612, and creates Si—F bonds that passivates the surface of the gate oxide. The Si—F bond is typically stronger than the traditional Si—H bond, and results in a fluorinated gate dielectric layer that is more stable and robust, and less likely to leak current due to stress. The LPCVD deposition process can be performed, for example, at between about 0.1 to 0.5 Torr.

Figure 6D:
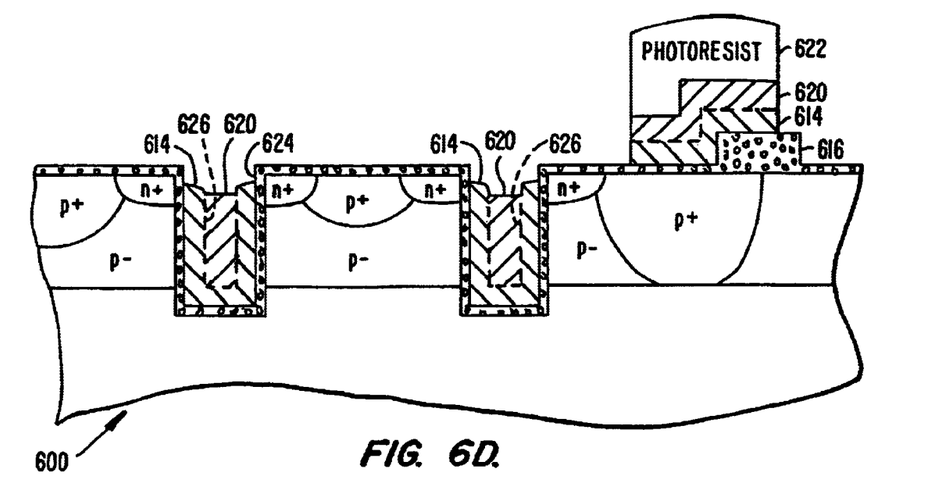

FIG. 6D is a simplified cross section of substrate 600 after the polysilicon/tungsten etch, but before the resist strip. A layer of photoresist 622 has been patterned to preserve gate tungsten 620 and polysilicon 614 over termination region 616. The etching step that clears the tungsten and polysilicon from the field, may or may not remove some of the polysilicon and tungsten from the trenches, possibly creating a recess 624 of the gate from the surface of the substrate. The gates of the various cells of the trench transistor are electrically coupled to the gate bus and gate pad by conventional methods (not shown).

The final processing after photoresist strip includes conventional steps of dielectric deposition followed by contact mask and etch, and metallization followed by metal mask and etch. Finally, the substrate is passivated followed by pad mask and etch and a final alloy step. Thus, the alloy step which may occur at, for example, about 400° C., is the only step that exposes the poly/tungsten interface inside the trench to a temperature cycle. This temperature treatment causes the formation of a thin layer of tungsten-polycide ($WSi_x$) 626 at the poly/tungsten interface. The resulting trench structure after the alloy step thus includes gate oxide 612, poly buffer 614, polycide 626 and tungsten 620.

Figure 7:
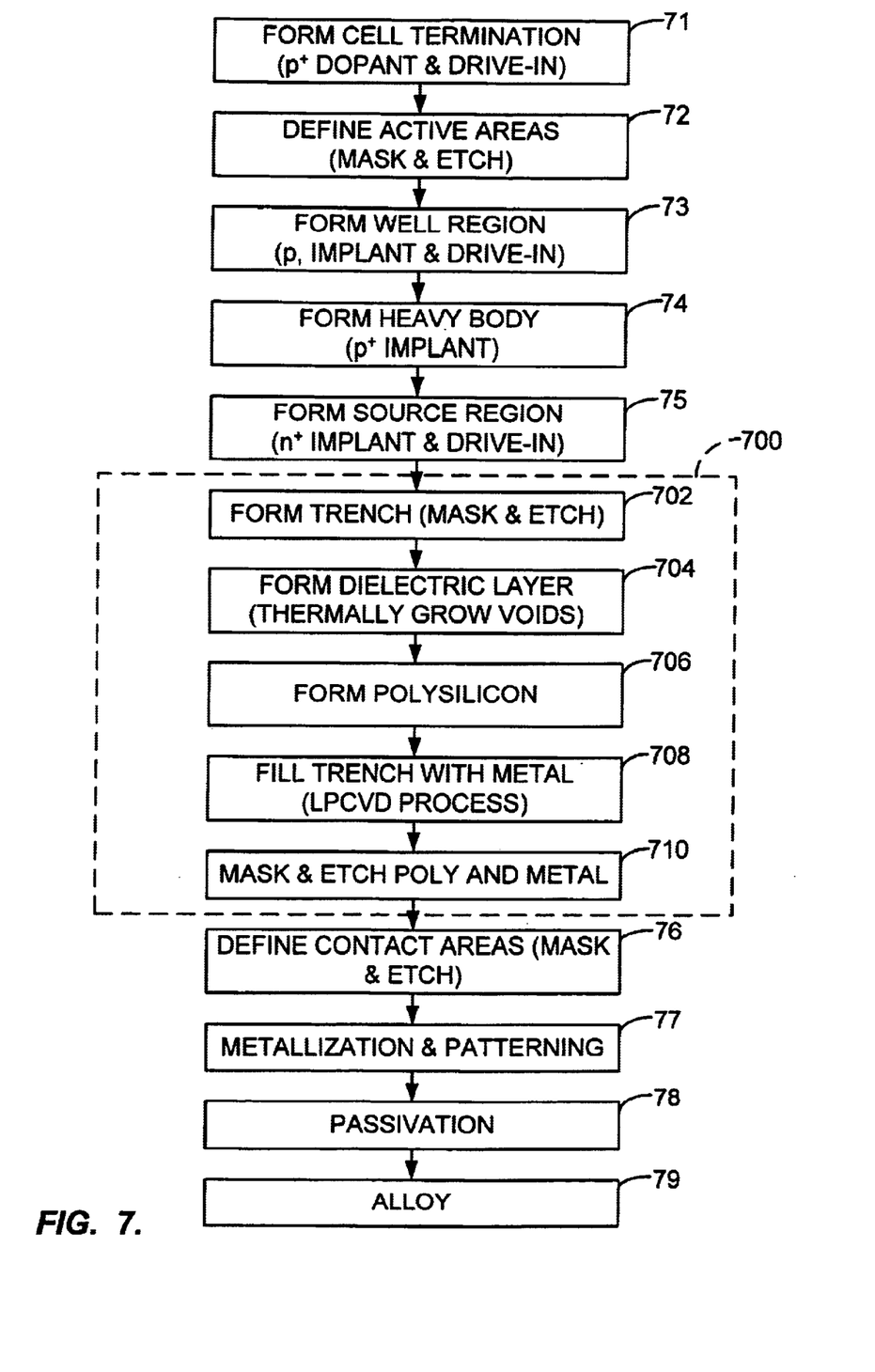
FIG. 7 is a simplified flow chart of a process according to the present invention.

FIG. 7 is a simplified flow chart of a process module for the formation of a metal-gate trench 700 according to an exemplary embodiment of the present invention in the context of a trench MOSFET process. In the example shown, trench process module 700 is placed as late in the process flow as possible to avoid exposing the trench to high temperature cycles. Thus, according to this embodiment, the steps of forming cell termination (71), defining active areas (72), forming a well (73) and heavy body (74), and source regions (75) occur prior to trench formation. Trench process module 700 according to the present invention includes a step of forming trenches in the substrate (step 702) followed by forming gate dielectric layer (e.g., $SiO_2$) on the sidewalls and bottom of the trench (step 704). Then, a layer of polysilicon is formed in the trench (step 706) over the gate dielectric layer. The polysilicon may be doped using one of a variety of different known doping mechanisms. The trench is then filled (step 708) with high-conductivity material such as tungsten using preferably an LPCVD process. A masking step protects selected portions of the metal layer and polysilicon during an etch step (710) that removes the metal and the polysilicon from the field of the substrate except where protected by the etch mask. Subsequent steps typically include defining of contact areas (76), metallization and patterning (77), passivation (78) and alloy (79) and are based on known methods to complete the fabrication process of the trench transistor.

The processing of the metal-gate trench (700) according to the present invention can be viewed as an independent process module that can be performed at different points within the process flow of a variety of different trench MOSFET processes. For example, the exemplary embodiment described above performs the trench process module preferably after the last dopant junction formation (i.e., after step 75) to avoid subsequent high temperature cycles. This minimizes the amount of polycide (or silicide) that forms at the poly-tungsten interface due to the temperature treatment and avoids undesirable thinning of the poly buffer which may otherwise contribute to increased leakage current. Minimum polycide formation also maximizes the gate conductivity. According to different embodiments of the present invention, however, the trench process module 700 may be performed before the formation of the source and body regions (e.g., between steps 72 and 73) or at any other suitable point in the process flow depending on the application.

Figure 8:
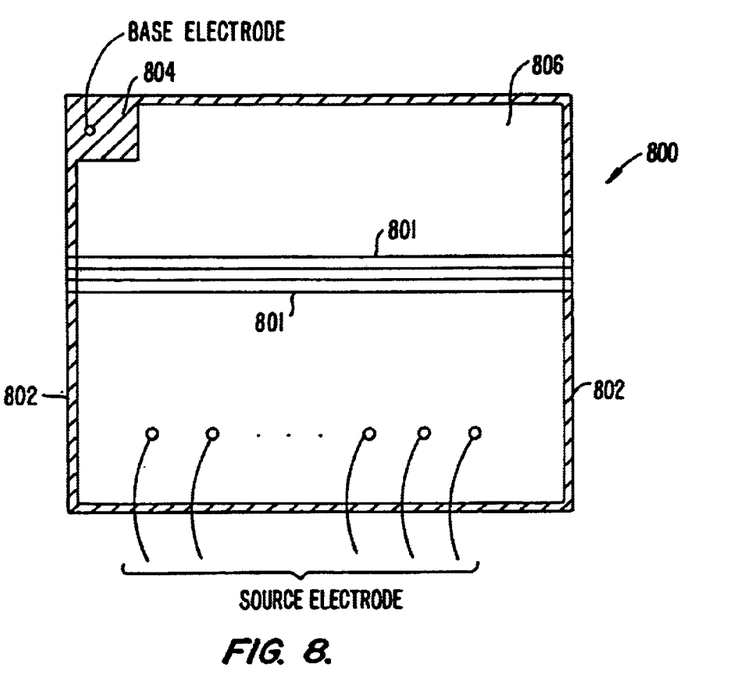
FIG. 8 is a top view of a large power MOSFET die showing the gate and source busing as enabled by the present invention.

There are a number of advantages offered by the metal-gate trench MOSFET of the present invention. With high-conductivity material such as metal used for forming the gate, trenches can extend over long distances without gate resistivity becoming a constraint. Thus, even for larger trench MOSFETs that are implemented on large dies, the metal-gate trench MOSFET process according to the present invention eliminates the need for segmentation of the trenches and busing of the gate metal across the die without compromising the gate switching speed. FIG. 8 is a simplified top view of a trench transistor die 800 according to an embodiment of the present invention. Trenches 801 extend full length across die 800 contacting a perimeter gate bus 802 that distributes gate charge from gate pad 804 to the active gate regions. Thus, source contact layer 806 can be a single contiguous square of metal which provides for much reduced $R_{DSon}$ compared to conventional trench transistor die with interior gate busing.

Another advantage of the metal-gate trench process of the present invention is significant improvement in gate oxide reliability and integrity. This is due to a combination of factors including the lowering of the polysilicon doping levels as allowed by the present invention. The higher conductivity of the gate metal allows reducing the polysilicon doping concentration without adversely impacting gate switching speed. For example, the resistivity of highly doped polysilicon is typically about 500 $\mu\Omega$-cm, as compared to 0.5 $\mu\Omega$-cm for tungsten, and 50 $\mu\Omega$-cm for polycide ($WSi_2$). Thus, the polysilicon layer need not be as highly doped as in conventional poly-gate trench MOSFETs. In the case of conventional n-channel trench MOSFETs, for example, it is typical to find $POCL_3$ highly doped polysilicon which is one of the major contributors to increased gate leakage current $I_{GSS}$. Instead of $POCL_3$, in one embodiment, the present invention dopes the buffer polysilicon layer by implanting, for example, phosphorous at reduced concentrations of, for example, $1\times10^{18}$. This directly results in reduced gate leakage current $I_{GSS}$. Further, another undesirable side effect of implants in the case of conventional p-channel trench MOSFETs, for example, is a phenomenon commonly referred to as boron penetration. Boron penetration occurs when the implanted boron penetrates through the gate oxide and into the channel region adversely affecting the MOSFET threshold voltage. The present invention allows for the reduction of the boron doping concentration requirements to, for example, $1\times10^{18}$, thus reducing the boron penetration effect. The reduced gate leakage current for n-channel transistors, reduced boron-penetration in the case of p-channel transistors, as well as the stronger Si—F bonds at the Si—$SiO_2$ interface (as described above) provide for a more robust trench MOSFET with significantly improved gate oxide reliability and integrity.

While the above is a complete description of specific embodiments of the present invention, various modifications, variations, and alternatives may be employed. For example, although specific embodiments of the low-resistivity trench process module have been described in the context of a trench MOSFET process, the same or a similar process module can be employed in other processes such as those forming trench capacitors or other similar structures. Also, while tungsten is given as an example of a low-resistivity gate material, other materials, such as titanium silicide or platinum silicide, or other refractory metals may be used in forming low-resistivity gate. Similarly, although polysilicon is given as an example of a gate buffer material, other materials may provide suitable stress relief while operating as a gate material in contact with the gate dielectric material. Further, the specific embodiment has been described in the context of silicon wafer processing for illustrative purposes only, and other types of substrates, such as a semiconductor-on-insulator substrate, a silicon-germanium substrate, or a silicon carbide substrate, for example, could be used with. Therefore, the scope of this invention should not be limited to the embodiments described, and should instead be defined by the following claims.

What is claimed is:

1. A method for fabricating a trench structure in a substrate, the method comprising the steps of:

(a) forming a trench in a substrate;

(b) forming a dielectric material lining at least a wall of the trench;

(c) forming a buffer layer on the dielectric material to fill a first portion of the trench, the buffer layer having a first electrical conductivity;

(d) substantially filling a remainder of the trench with a high-conductivity material having a second electrical conductivity, the second electrical conductivity being greater than the first electrical conductivity; and (e) forming a polycide layer in the trench between the buffer layer and the high-conductivity materials, wherein the polycide layer, the buffer layer and the high-conductivity material are in the trench after (e).

2. The method of claim 1 wherein the step of forming a buffer layer comprises forming a layer of polysilicon.

3. The method of claim 2 wherein the step of forming a layer of polysilicon further comprises a step of implanting the layer of polysilicon.

4. The method of claim 2 wherein the step of filling the remainder of the trench with the high-conductivity material comprises forming a layer of refractory metal.

5. The method of claim 4 wherein the step of forming a layer of refractory metal comprises using a low pressure chemical vapor deposition (LPCVD) process.

6. The method of claim 5 wherein a fluoride-containing precursor is used in the LPCVD process.

7. The method of claim 6 wherein the fluoride-containing precursor comprises tungsten hexafluoride.

8. The method of claim 4 wherein the trench structure is formed as part of a trench transistor including dopant junctions, and wherein forming the trench occurs after the dopant junctions are formed.

9. A method for fabricating a trench transistor, the method comprising:

(a) forming a trench with sidewalls in a bulk silicon region of a substrate;

(b) growing a gate oxide layer to line the trench;

(c) depositing a conformal layer of polysilicon on the gate oxide layer to fill a first portion of the trench, thereby coating the sidewalls of the trench;

(d) stopping (c) so that the conformal layer of polysilicon has a U-shaped profile; and (e) substantially filling a remainder of the trench with a metal layer formed in a low pressure chemical vapor deposition (LPCVD) process.

10. The method of claim 9 wherein the step of filling comprises depositing tungsten by the LPCVD process using tungsten hexafluoride as a precursor.

11. The method of claim 9 wherein the metal layer is a refractory metal.

12. The method of claim 9 wherein the metal layer completely fills the remainder of the trench.

13. The method of claim 1 wherein substantially filling the remainder of the trench includes completely filling the remainder of the trench with the high-conductivity material.

14. The method of claim 13 wherein the high-conductivity material includes tungsten.

15. The method of claim 1 wherein the buffer layer comprises polysilicon, wherein the buffer layer has a resistivity less than about 500 $\mu\Omega$-cm.

16. The method of claim 9 wherein the conformal layer has a resistivity less than about 500 $\mu\Omega$-cm.

17. The method of claim 9 wherein the trench transistor is a vertical power MOSFET.

* * * * *